United States Patent
Wallner et al.

(10) Patent No.: US 7,339,840 B2
(45) Date of Patent: Mar. 4, 2008

(54) MEMORY SYSTEM AND METHOD OF ACCESSING MEMORY CHIPS OF A MEMORY SYSTEM

(75) Inventors: Paul Wallner, Prien (DE); Ralf Schledz, Zolling (DE); Peter Gregorius, Munich (DE); Hermann Ruckerbauer, Moos (DE)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 11/128,789

(22) Filed: May 13, 2005

(65) Prior Publication Data

US 2006/0291263 A1    Dec. 28, 2006

(51) Int. Cl.
  *G11C 7/00*  (2006.01)
(52) U.S. Cl. .................. 365/191; 365/198; 365/230.03
(58) Field of Classification Search .................. 365/51, 365/63, 191, 198, 230.03
See application file for complete search history.

(56) References Cited

U.S. PATENT DOCUMENTS

| | | | | |
|---|---|---|---|---|
| 6,108,745 A | * | 8/2000 | Gupta et al. ................... | 711/3 |
| 6,178,126 B1 | * | 1/2001 | Kirihata et al. .............. | 365/200 |
| 6,356,106 B1 | * | 3/2002 | Greeff et al. ................. | 326/30 |
| 6,496,445 B2 | * | 12/2002 | Lee .............................. | 365/233 |
| 6,683,372 B1 | * | 1/2004 | Wong et al. ................. | 257/686 |
| 2005/0036349 A1 | * | 2/2005 | Jakobs et al. ................. | 365/51 |
| 2006/0092721 A1 | * | 5/2006 | Lee .............................. | 365/191 |
| 2006/0126369 A1 | * | 6/2006 | Raghuram ................... | 365/51 |
| 2006/0129755 A1 | * | 6/2006 | Raghuram ................... | 711/105 |

* cited by examiner

*Primary Examiner*—Richard T. Elms
*Assistant Examiner*—Alexander Sofocleous
(74) *Attorney, Agent, or Firm*—Dicke, Billig & Czaja PLLC

(57) ABSTRACT

A memory system and method is discussed. The memory system includes a memory controller and at least one memory module on which a certain number of semiconductor memory chips and connecting lines are arranged in a respectively specified topology. The connecting lines include first connecting lines forming transfer channels for a protocol based transfer of data and command signal streams from the memory controller to at least one of the memory chips on the memory module and from there to the memory controller, respectively. Second connecting lines are routed separately from the memory controller directly to at least one of the memory chips on the memory module for transferring select information to the at least one memory chip separately from the data and command signal streams.

29 Claims, 7 Drawing Sheets

MEMORY SYSTEM AND METHOD OF ACCESSING MEMORY CHIPS OF A MEMORY SYSTEM

FIELD OF THE INVENTION

The present invention relates to a memory system comprising a memory controller and at least one memory module on which a certain number of semiconductor memory chips and connection lines are arranged in a specified topology and a method of accessing semiconductor memory chips of such a memory system.

BACKGROUND

Recent developments in fast semiconductor memories will lead to high speed signal transmission rates of for example up to 7 Gbit/s. These high signal transmission rates require careful design considerations with respect to the implementation of an appropriate topology and a suitable method of access of the memory chips on a memory module from a memory controller.

Enclosed FIG. 1 depicts a functional block diagram of an example of a heretofore known shared loop architecture which is a possible solution how to arrange a certain number of memory chips (for example DRAM chips) on a memory module 100 considering the connection to a memory controller 150. On the memory module 100 (for example a DIMM) for memory chips (or memory ranks) 110, 120, 130, 140 are arranged in such a way, that a command and data signal stream CawD is transferred from the memory controller 150 through a first transfer channel 102 to a first memory chip 110, from the first memory chip 110 through a second transfer channel 112 to a second memory chip 120, from the second memory chip 120 through a third transfer channel 122 to a third memory chip 130 from the third memory chip 130 through a fourth transfer channel 132 to a fourth memory chip 140 and from the fourth memory chip 140 through a fifth transfer channel 142 back to the memory controller 150.

In the above example of a shared loop architecture the memory module 100 may be a DIMM on which, for example, four DDR-DRAM memory chips having the same functionality are arranged. Data and command signals in the signal stream CawD are protocol-based and the connecting lines forming the transfer channels are connecting the DDR-DRAMs in the consecutive order as mentioned above and depicted in FIG. 1. That is, data and command signal stream CawD can only flow in one direction.

A further heretofore known example of a star topology architecture which is also appropriate for arranging memory chips on a memory module 200 and connecting the same to a memory controller 250 is illustrated in the functional block diagram of the enclosed FIG. 2. Four memory chips, for example, DDR-DRAM chips 210, 220, 230 and 240 are arranged on the memory module 200 in such a way that a command and data signal stream CawD is transferred from the memory controller 250 to one dedicated memory chip 210, in the following called "master" memory chip and from there back to the memory controller 250 (read data rD). Further, the command and data signal stream CawD can be transferred from the master memory chip 210 to a first memory chip 220 or a second memory chip 230 or a third memory chip 240 and from there back to the master memory chip 210. Like in the shared loop architecture depicted in FIG. 1 the data and command signals of the signal stream CawD in the star topology illustrated in FIG. 2 are protocol-based.

Since the memory chips on the exemplified memory modules 100 and 200 illustrated in FIGS. 1 and 2 must be accessed very flexible, there must be the possibility to perform certain operations, for example set-up operations in advance, i.e. before the actual command and data stream on the protocol basis has reached the memory chip. Especially the memory chips 110, 120, 130 and 140 in the shared loop topology illustrated in FIG. 1 and the master memory chip 210 in the star topology illustrated in FIG. 2, have/has to separate very fast and easily between re-drive and data processing tasks. Further, power consumption and related thermal effects are critical issues in both the shared loop topology and the star topology. The overall power consumption has to be kept as low as possible.

Up to now a proposal exists to transfer a rank select command or a clock enable command or even no clock enable command within a protocol-based frame on the regular command and data stream. This is very inflexible, because a) the frame must be decoded to find out what is the rank select information or the clock enable information, i.e. which memory chip is addressed, for example the first memory chip 110, the second memory chip 120, the third memory chip 130 or the fourth memory chip 140 in the shared loop topology according to FIG. 1, or in the star topology according to FIG. 2 the master memory chip 210, the memory chip 220, the memory chip 230 or the memory chip 240 for data processing, for re-driving or for a low power stand-by mode;

b) the memory chips cannot be accessed in advance for certain set-up procedures or for certain power related procedures;

c) the memory chips cannot be accessed independently from the command and data stream;

d) the memory chips in the shared loop topology according to FIG. 1 and the master memory chip 210 in the star topology according to FIG. 2 have to separate between re-drive vs. memory chip read/write procedures—with a protocol included rank select, this leads to a higher logical effort;

e) because the rank select command and the clock enable information have to be decoded when they are included in the protocol, the main blocks in the chip are involved—even if only a re-drive has to be performed in a memory chip and therefore power consumption increases.

SUMMARY

Embodiments of the invention provide a memory system and method of accessing a memory system. In one embodiment, the invention provides a memory system including a memory controller and at least one memory module on which a certain number of semiconductor memory chips and connecting lines are arranged in a respectively specified topology. The connecting lines include first connecting lines forming transfer channels for a protocol based transfer of data and command signal streams from the memory controller to at least one of the memory chips on the memory module and from there to the memory controller. Second connecting lines are routed separately from the memory controller directly to at least one of the memory chips on the memory module for transferring select information to the at least one memory chip separately from the data and command signal streams.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
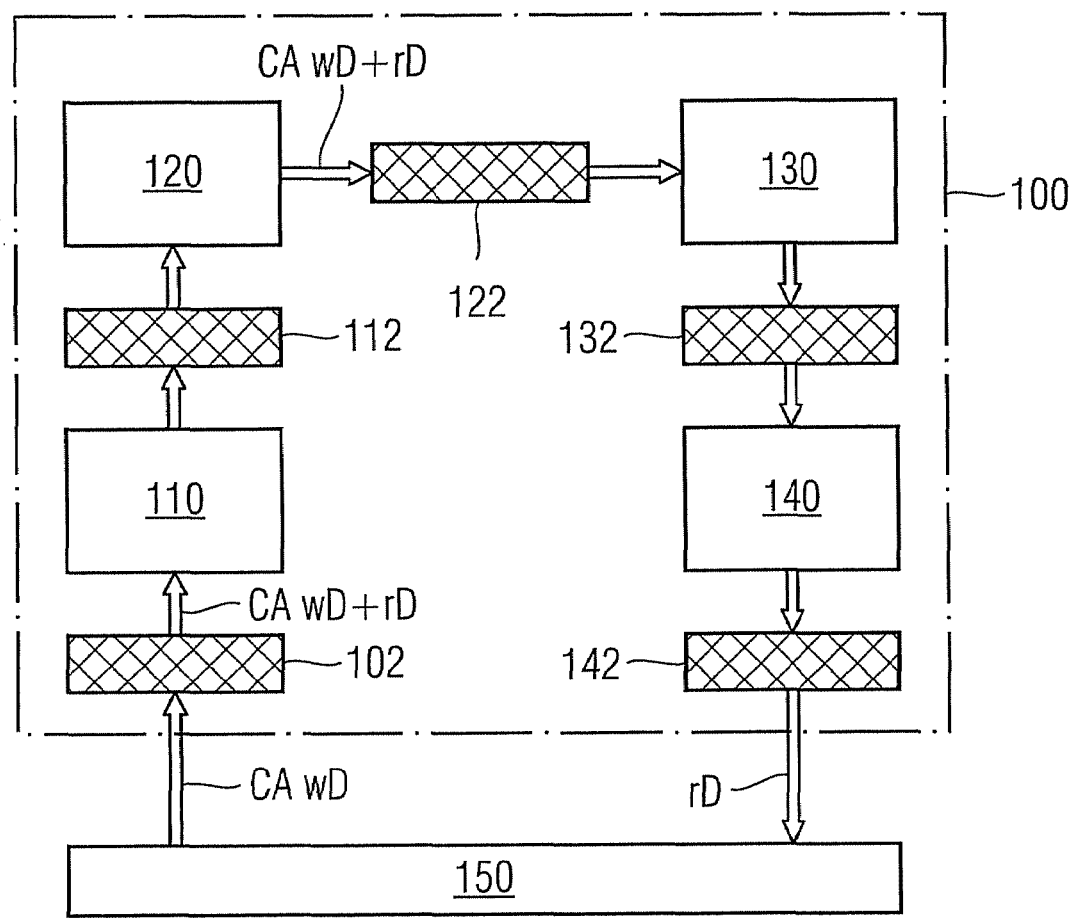
FIG. 1 is a schematic functional block diagram of a first example of a prior art memory system arranged in a shared loop topology.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides a memory system which enables a very flexible and fast access to memory chips on a memory module and provides the possibility to perform certain operations, i.e. set-up operations, power down and power on operations in advance, i.e. before the actual command and data stream on protocol basis has reached the memory chip and independent from the command and data stream.

In another embodiment, the present invention to provide a method of accessing in a flexible manner memory chips on a memory module which can achieve to perform certain operations, such as set-up operations, for example for power on or power down in advance, i.e., before the actual command and data stream on protocol basis has reached a memory chips and independently from the command and data stream.

In one embodiment, the invention provides a memory system including a memory controller and at least one memory module on which a certain number of semiconductor memory chips and connecting lines are arranged in a respectively specified topology. The connecting lines include first connecting lines forming transfer channels for a protocol based transfer of data and command signal streams from the memory controller to at least one of the memory chips on the memory module and from there to the memory controller, respectively, and second connecting lines routed separately from the memory controller directly to at least one of the memory chips on the memory module for transferring select information to the at least one memory chip separately from the data and command signal streams.

In the memory system according to the above embodiment of the invention, the select information, i.e., the rank signal and/or the clock enable signal is separated from the usual protocol based command and data stream. Moreover, the separate select information is connected by the second connecting lines directly from the memory controller to the memory module. This architecture provides a) flexibility to perform set-up operation and power reduction operations in advance;

b) flexibility to perform certain operations, for example power reduction operations independently from command and a data stream;

c) makes effective power reduction techniques possible due to separate information transfer through the second connecting lines;

d) allows to separate efficiently between re-drive and real data processing commands in the memory chips for example in the master memory chip and therefore avoids traffic on the lanes;

e) makes a concurrent re-drive possible while data processing is performed in a certain memory chip, for example in the master memory chip; and f) reduces power consumption because decoding of the protocol-based command and data stream as to which memory chip has to be in data processing mode and which memory chip has to be kept in low power mode is not necessary anymore.

In one embodiment of the inventive memory system, where the semiconductor memory chips are arranged in a star topology on the memory module and the at least one memory chip is a dedicated master memory chip, the first connecting lines from and to the memory controller are only connected to the master memory chip having a re-drive function at least for the data and command signals. The other memory chips on the memory module are respectively connected by the first connecting lines only to the master memory chip while forming the star topology.

In this embodiment where the semiconductor memory chips are arranged in a star topology, the second connecting lines are connecting the memory controller for transferring the separate select information in a point-to-point connection only with the master memory chip.

In an advantageous development thereof, the second connecting lines are further connecting the master memory chip with each of the other memory chips on the memory module, and the master memory chip has the re-drive function also for the separate select information.

In this embodiment of the inventive memory system where the semiconductor memory chips are arranged in the star topology, the second connecting lines according to an alternative version are connecting the master memory chip and all other memory chips in parallel with the memory controller.

According to a second preferred embodiment of the inventive memory system, the semiconductor memory chips are arranged on the memory module in a shared loop or loop forward topology. The first connecting lines are connecting the memory controller with a first memory chip and with the last memory chip of the loop in one and the same transfer direction, and all memory chips on the memory module have a re-drive function for at least the data and command signals so that each memory chip is respectively connected by the first connecting lines to the adjacent memory chip of the loop.

In the second preferred embodiment, the second connecting lines may be arranged to connect all memory chips on the memory module in parallel to the memory controller.

In an alternative version of the second embodiment, the second connecting lines connect all memory chips on the memory module in a star topology to the memory controller.

According to a further alternative version of the second embodiment, the second connecting lines connect the memory controller with the memory chips in a fly-by topology so that the memory controller and the first to the last memory chip on the memory module are connected in one and the same transfer direction, and the first to the last but one memory chips on the memory module have a re-drive function also for the separate select information.

According to one embodiment of the inventive memory system, at least four memory chips are arranged on the memory module, and the second connecting lines include at least two parallel connecting lines for transferring the separate select information as at least a two-bit signal.

The separate select information may include a rank select signal for selecting a memory rank constituted by a memory chip. According to another example the separate select information includes a clock enable signal for enabling/disabling separate clocking of the memory chips.

In the memory system according to the invention the memory chips may comprise DDR-DRAM-memory chips.

According to a second essential aspect of the invention in a memory system comprising a memory controller and at least one memory module on which a certain number of semiconductor memory chips and connection line are arranged in a respectively specified topology, the invention provides a method of accessing the semiconductor memory chips, wherein the method includes providing first connecting lines between the memory controller and at least one of the semiconductor memory chips on the memory module, transferring through channels formed by the first connecting lines, protocol-based data and command signal streams from the memory controller to the at least one semiconductor memory chip on the memory module and from there to the memory controller, respectively, providing separately from the first connecting lines second connecting lines from the memory controller directly to at least one of the memory chips on the memory module, and transferring select information through the second connecting lines from the memory controller to the at least one memory chip on the memory module separately from the data and command signal streams, wherein a predetermined function of the at least one memory chip is enabled/disabled in dependency of the select information.

The present invention is described for examples of memory systems arranged in a shared loop, or star topology, and also for a memory system having a loop forward architecture.

Figure 3:
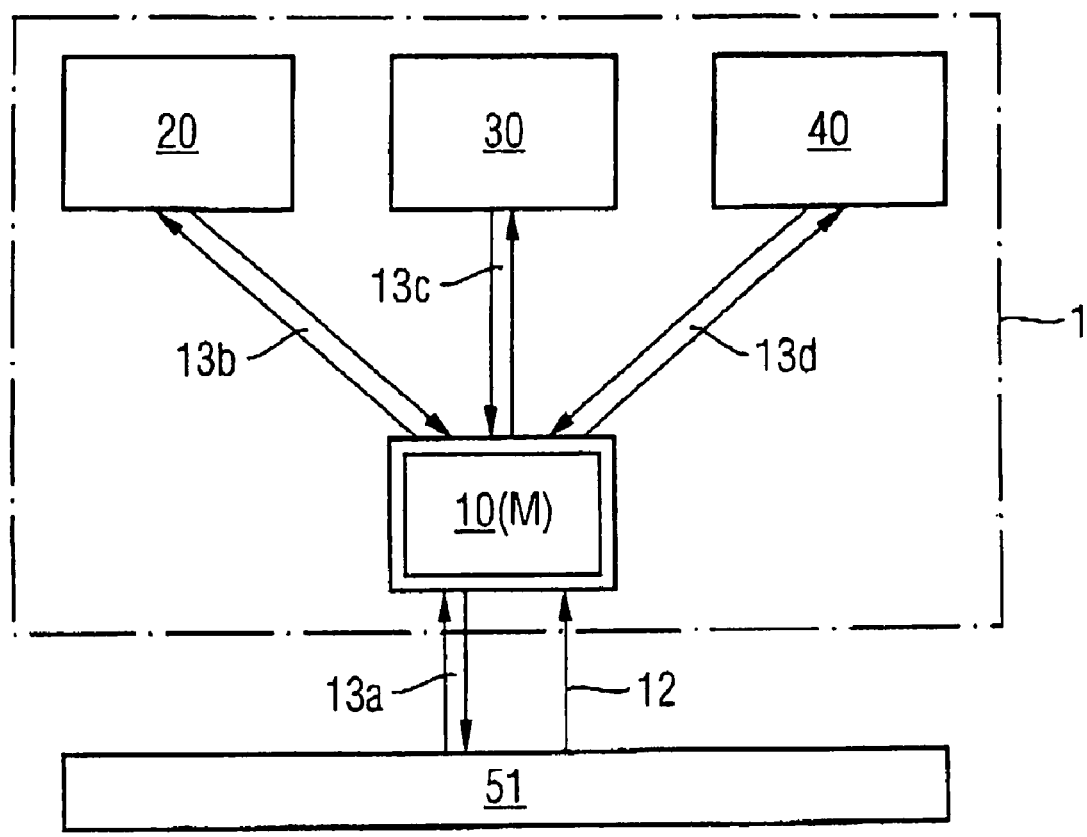
FIG. 3 illustrates a schematic functional block diagram of a first version of a memory system according to a first embodiment of the invention wherein the memory chips are arranged in a star topology.
Figure 4:
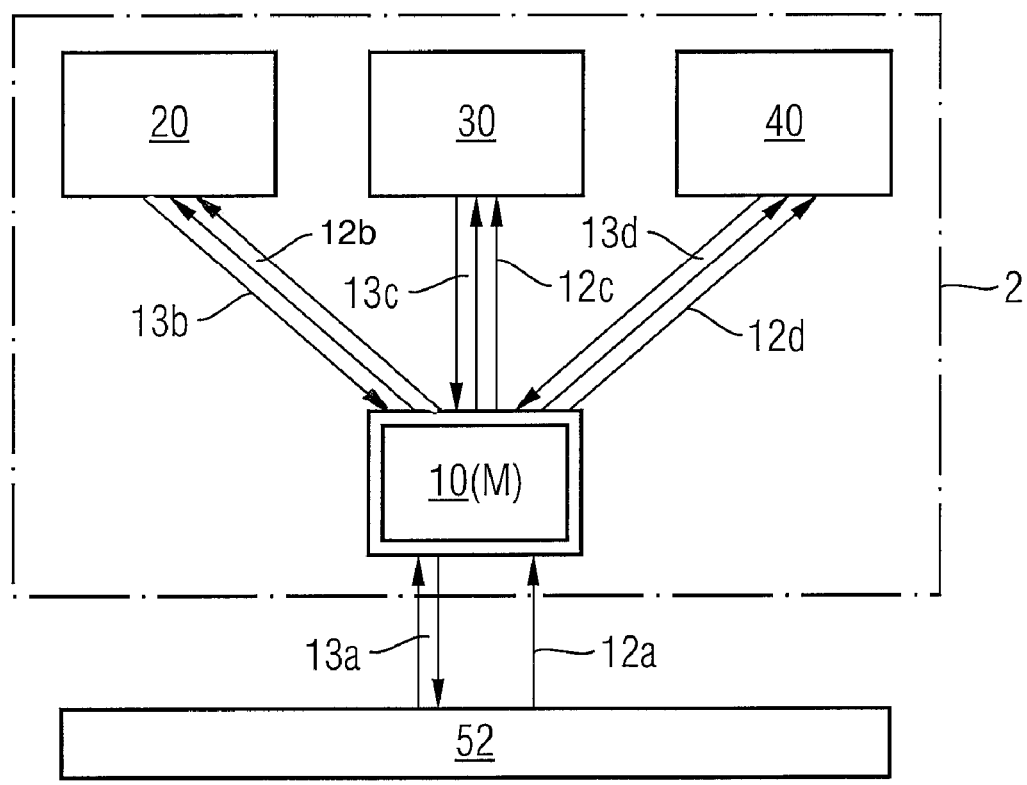
FIG. 4 schematically illustrates a functional block diagram of a second alternative version of the first embodiment of the inventive memory system, where the memory chips are arranged in a star topology.
Figure 5:
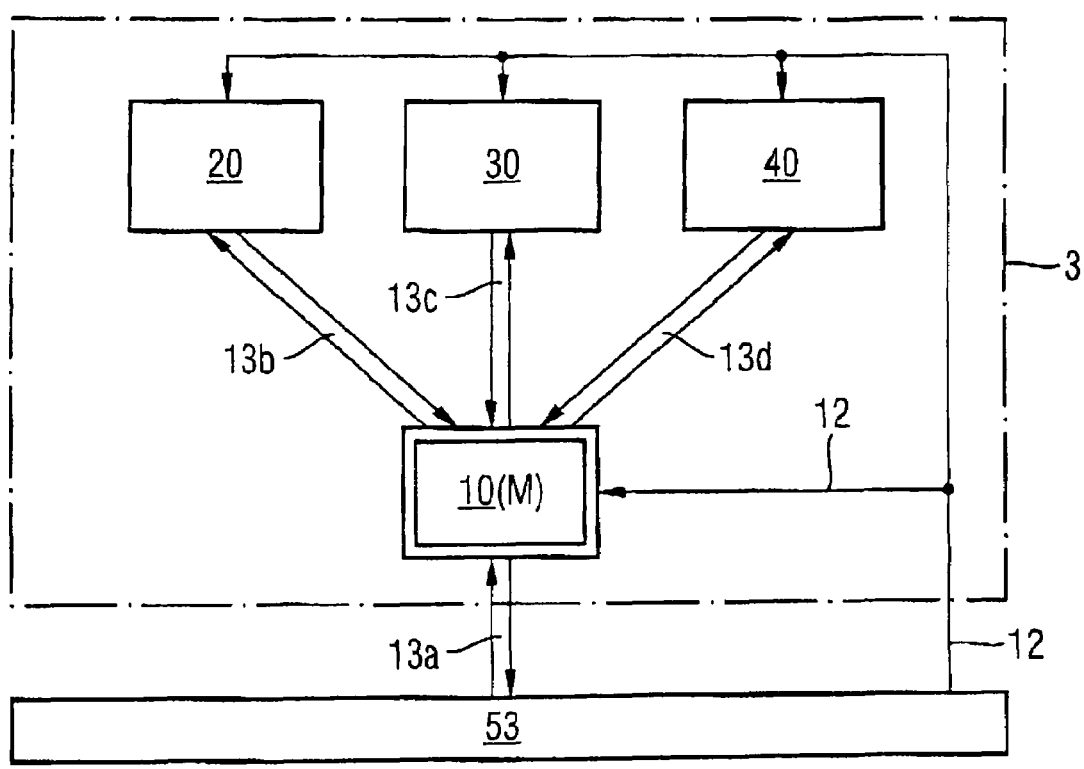
FIG. 5 schematically illustrates a functional block diagram of a third alternative version of the first embodiment of the inventive memory system, where the memory chips are arranged in a star topology.

The following will describe a first embodiment of a memory system according to the invention referring to the enclosed FIGS. 3 to 5, wherein the memory chips are arranged in a star topology on the memory board.

Figure 2:
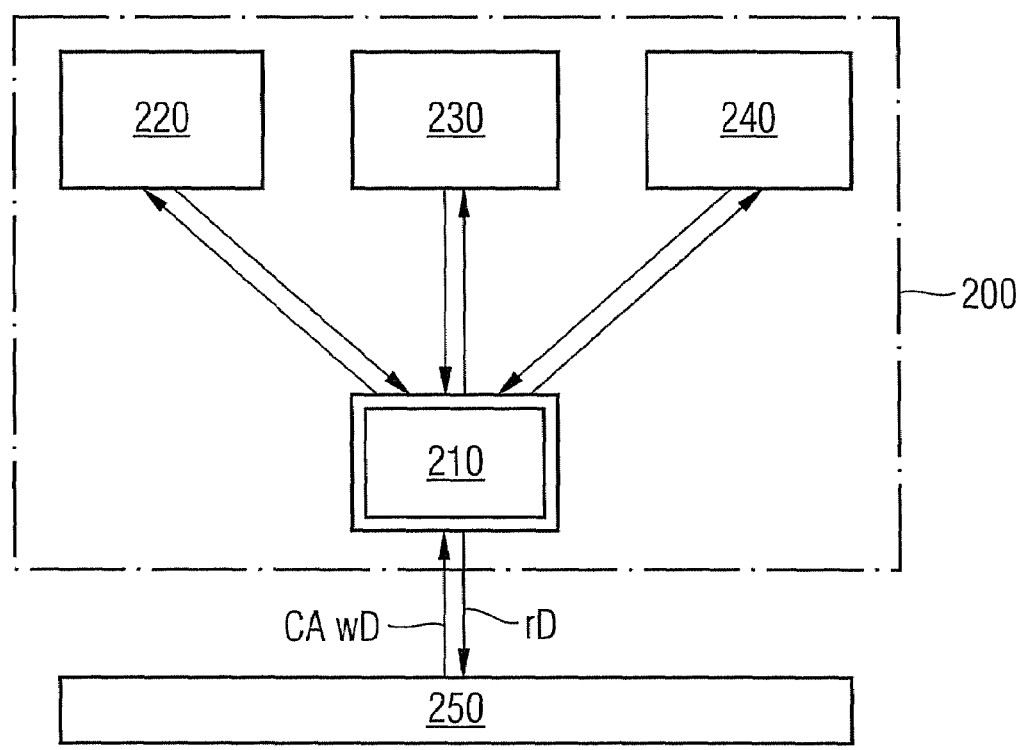
FIG. 2 is a schematic functional block diagram of a second example of a prior art memory system wherein the memory chips are arranged in a star topology.

The first version of the memory system according to the first preferred embodiment of the invention is schematically illustrated in FIG. 3 and includes as an example four memory chips 10(M), 20, 30, 40 arranged in a star architecture on a memory module 1. A first one, namely the memory chip 10(M) is a dedicated memory chip (in the following called a master memory chip) and connected by bi-directional first connecting lines 13a, 13b, 13c and 13d on one side with a memory controller 51 and on the other side in a star topology with three slave memory chips 20, 30 and 40. The first connecting lines 13a, 13b, 13c, 13d are forming channels for a protocol-based transfer of data and command signal streams like it is described in the introductory part of the description with reference to FIG. 2. The data and command signal streams are transferred from the memory controller 51 at first to the master memory chip 10(M) and secondly from the master memory chip 10(M) to the slave memory chips 20 or 30 or 40 respectively and further from the slave memory chips 20 or 30 or 40 to the master memory chip 10(M) and from there back to the memory controller 51.

Moreover the memory system of the first preferred embodiment comprises second connecting lines 12 directly connecting the memory controller 51 to the master memory chip 10(M) and provided for separately transferring select information from the memory controller 51 to the master memory chip 10(M). Separate transfer means that this select information is transferred separately from the data and command signal streams transferred through the first connecting lines.

The select information may include a rank select signal transferred to the master memory chip 10(M) having the highest importance due to distinguish loop trough vs. data processing tasks therein. Further the separate select information may include a clock enable signal to allow smart power reduction operations.

A second version of the first embodiment of the memory system according to the invention as it is depicted in FIG. 4 is also arranged in star topology like the version of the inventive memory system depicted in FIG. 3 as concerns the connection of the master memory chip 10(M) and the slave memory chips 20, 30 and 40 on the memory module 2 by means of the first connecting lines 13a, 13b, 13c and 13d. However, in the alternative version depicted in FIG. 4, the second connecting lines 12a, 12b, 12c and 12d are not only connecting the memory controller 52 to the master memory chip 10(M) for transferring the select information to the master memory chip 10(M) but are further connecting the master memory chip 10(M) with each of the slave memory chips 20, 30 and 40 separately from the transfer channels formed by the first connecting lines 13b, 13c and 13d. In this version, the master memory chip 10(M) has an additional re-drive function also for the separate select information received from the memory controller 52 for re-driving it to the slave memory chips 20 or 30 or 40.

Like in the version of the inventive memory system described before with reference to FIG. 3, the separate select information may include a rank select signal for set-up in advance and access of the memory chips 10(M), 20, 30 or 40, or the separate select information may comprises a clock enable signal to allow smart power reduction measures not only in the master memory chip 10(M) but also in the slave memory chips 20, 30 and 40.

FIG. 5 schematically illustrates a functional block diagram of a third version of the first preferred embodiment, wherein the master memory chip 10(M) and the slave memory chips 20, 30 and 40 are arranged on the memory module 3 in a star topology and connected together and with a memory controller 53 by means of the first connecting lines 13a, 13b, 13c and 13d for transferring the protocol-based data and command signal streams. The arrangement of the second connecting lines is however different from that of the first version according to FIG. 3 and the second version according to FIG. 4. Namely, the second connecting lines 12 in FIG. 5 are connecting the master memory chip 10(M) and the slave memory chips 20, 30 and 40 in parallel to the memory controller 53. Like in the version schematically outlined in FIG. 4, the separate select information may include a rank select signal allowing high flexibility for set-up in advance and access to the memory chips and a clock enable signal to perform certain power reduction operations independently from the command and data stream so that a power consumption of a memory chip which is not used for data write or read processing can be effectively reduced.

The first preferred embodiment of the memory system according to the invention addresses the star topology architecture as being a favourable solution how to arrange memory chips such as DDR-DRAMs on a memory module, for example a DIMM, considering also the connection to the memory controller. In this star topology the memory chips on the memory module are arranged in such a way that a command and data stream is transferred: memory controller↔master memory chip↔ first slave memory chip or second slave memory chip or third slave memory chip. Data and command stream are protocol-based. The routing of the second connecting lines separately from the first connecting lines achieves to transfer separate select information from the memory controller directly to at least one, for example, the master memory chip on the memory module. Such a separately transferred select information may include a rank select signal which can be used to perform set-up procedures at least within the master memory chip or to pre-indicate certain data processing tasks in the first to third slave memory chips. Further the select information may include a clock enable signal which allows smart power reduction measures because decoding of which memory chip has to be in data processing mode and which memory chip has to be kept in low power mode is not necessary anymore.

An arbitrary bus width is possible for the transfer of the separate select information through the second connecting lines. Mainly the bus width depends on both, the amount of information to be transferred, an available area on the memory module and the number of memory chips to be accessed. According to the three alternative versions described above referring to the functional block diagrams depicted in FIGS. 3 to 5, the separate select information can be wired on the memory module in different manners. In any of these versions, the second connecting lines connect the memory controller with the memory module in a point-to-point manner. Different wiring scenarios are possible on the memory module, like:

a) only one master memory chip 10(M) is connected (FIG. 3);

b) the second connecting lines connect at first the master memory chip 10(M) which then re-drives the separate select information to the slave memory chips 20, 30, 40 (FIG. 4);

c) only master memory chip 10(M) is directly connected to the memory controller, and the select information to the slave memory chips 20, 30 and 40 is included in the protocol (FIG. 3) or d) parallel connection of the second connecting lines (in fly-by- or star topology) to all memory chips (FIG. 5).

The second embodiment of the memory system according to the invention addresses the loop forward and the shared loop architecture which are a second favorable solution how to arrange memory chips, for example DDR-DRAMs, on a memory module such as a DIMM also considering the connection to the memory controller. In this architecture (for shared loop architecture refer also to FIG. 1 described in the introductory part of the description), the memory chips on the memory-module are arranged in such a way that the command and data stream is transferred: memory controller→first memory chip→second memory chip→third memory chip→fourth memory chip and from the fourth memory chip back to the memory controller. Also in this topology data and command streams are protocol-based and connecting the memory chips in this consecutive order. The data and command stream can only flow in one direction.

Since the memory chips on the memory module must be accessed very flexible, the second embodiment of the inventive memory system proposes to separately transfer select information which may include a rank select signal and/or a clock enable signal through second connecting lines which are routed separately from first connecting lines transferring the data and command signal streams from the memory controller to at least one of the memory chips on the memory module. The separate rank select signal and the clock enable signal can be combined to one signal, if the memory chip is always shut off when it is not accessed.

Also in the second preferred embodiment much more flexibility is achieved, since the rank select signal and/or the clock enable signal is separately transferred and directly connected in a point-to-point manner from the memory controller to the memory module. Such a rank select signal can be used to perform set-up procedures within the memory chips or to pre-indicate certain data processing tasks. Also in this embodiment the bus width of the second connecting lines for transferring the separate select information depends on both, the amount of information to be transferred and on the available area on the memory module.

Figure 6:
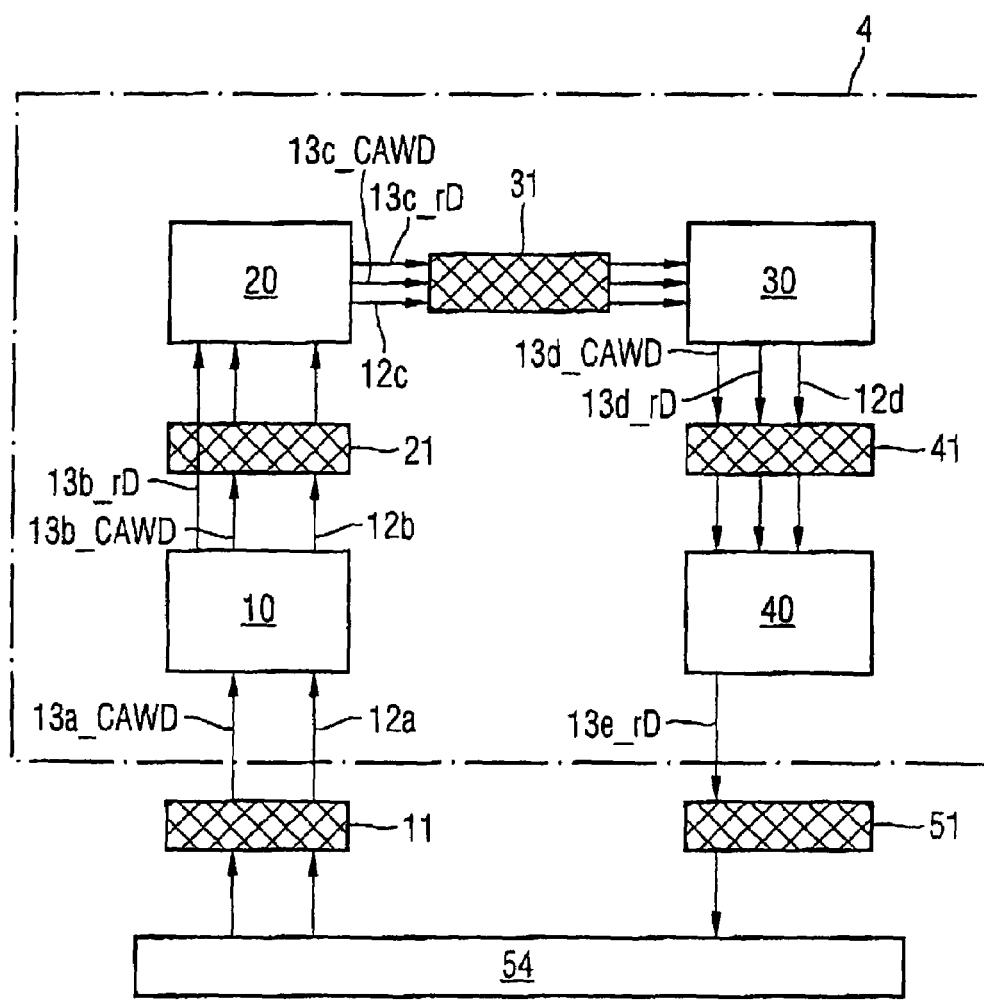
FIG. 6 schematically illustrate a functional block diagram of a first version of a second embodiment of a memory system according to the invention, where the memory chips are arranged in a loop forward topology.
Figure 7:
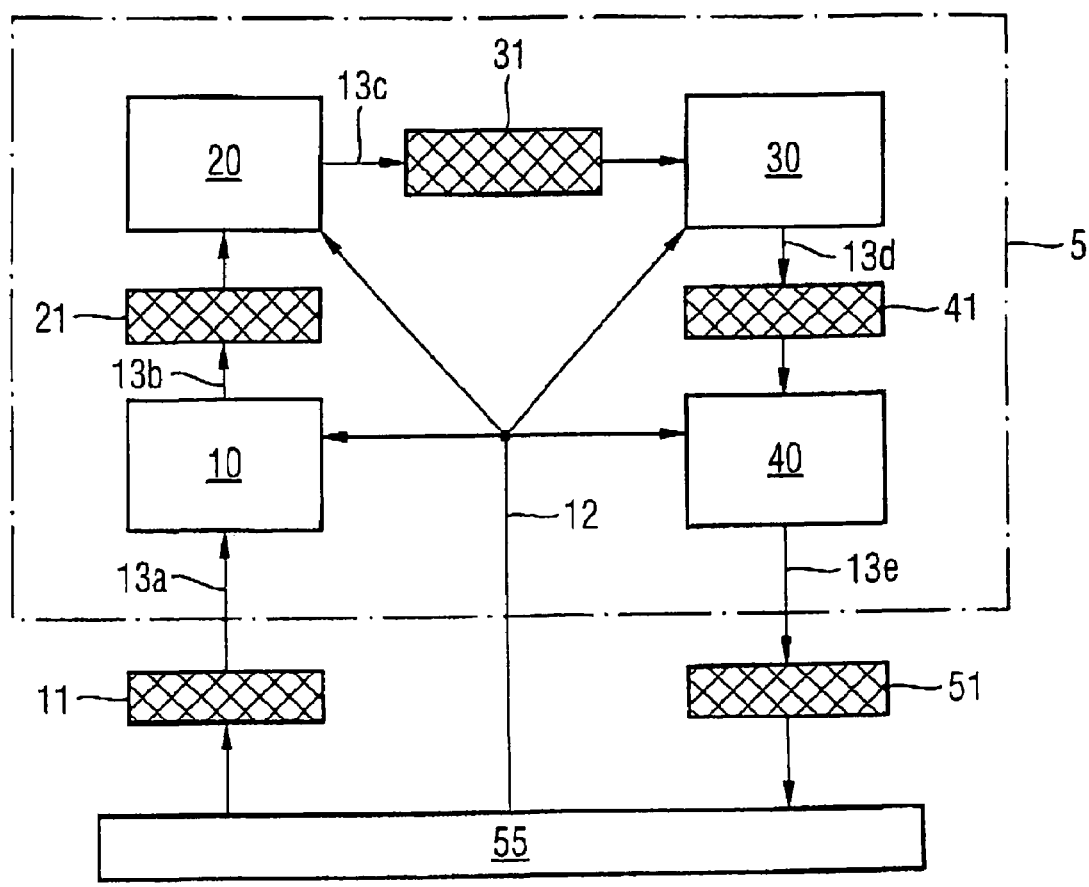
FIG. 7 schematically illustrates a functional block diagram of an alternative version of the second embodiment of the memory system according to the invention, where the memory chips are arranged in a shared loop architecture.

According to the functional block diagrams depicted in FIGS. 6 and 7, the second connecting lines can be wired on the memory module in different manner.

The select information may also include a clock enable signal which can be used to switch-on/off clocks in the memory chips and therefore save power. For power consumption two modes are of interest, namely re-drive mode and data processing mode. Because the clock enable signal is transferred through the second connecting lines separately from the data and command signal stream, the decoding of which memory which has to be in data processing mode and which memory chip has to be kept in low power mode is not necessary anymore but directly indicated by the separated clock enable signal.

In the first version of the second embodiment applied to a memory system having a loop forward architecture as illustrated in FIG. 6, four memory chips 10, 20, 30 and 40 constituting four memory ranks are arranged on a memory module 4. Transfer channels 11, 21, 31, 41 and 51 are formed between a memory controller 54, the first memory chip 10, the second memory chip 20, the third memory chip 30 and the fourth memory chip 40 and the memory controller 54, respectively. First connecting lines 13a_CAwD, 13b_CAwD, 13b_rD, 13c_CAwD, 13c_rD, 13c_CAwD, 13d_rD and 13e_rD of the transfer channels mentioned above are arranged in the forward loop architecture for transferring the protocol-based data and command signal streams, separated in the connecting lines 13a_CAwD, 13b_CAwD, 13c_CAwD and 13d_CAwD for transferring write, address and command signals CAwD and in the connecting lines 13b_rD, 13c_rD, 13d_rD and 13e_rD for transferring read signals rD.

Second connecting lines 12a, 12b, 12c and 12d are provided in a fly-by architecture separately from the first connecting lines 13a_CAwD, 13b_CAwD, 13b_rD, 13c_CAwD, 13c_rD, 13c_CAwD, 13d_rD and 13e_rD for transferring select information, i.e. a clock enable signal and/or a rank select signal from the memory controller 54 to the first memory chip 10, from there to the second memory chip 20, from there to the third memory chip 30 and from there to the fourth memory chip 40 on the memory module 4.

In the functional block diagram of a memory system arranged in a shared loop topology illustrated in FIG. 7 a different kind of connection of the second connecting lines 12 from a memory controller 55 to the memory chips 10, 20, 30, 40 on the memory module 5 is depicted.

In the memory system depicted in FIG. 7, the second connecting lines 12 are implemented on the memory module 5 in a star topology.

According to a further alternative version (not illustrated), the kind of connection can be a parallel connection of the second connecting lines 12, which however has the drawback of a higher pin count on the memory module.

It is further to be mentioned that the present invention can also be applied for memory systems having a combination of a star topology and a loop forward topology. There is also the possibility of providing two master chips and also mixtures of the connecting lines for CAwD and rD, for example CAwD in form of point-to-three points connection and rD as a loop forward topology. Further, notably, the present description and the relating FIGS. 6 and 7 always describe and illustrate the CAwD and the rD busses (first connecting lines) arranged as point-to-point connections. However, the skilled person will easily recognize alternative kinds of connections, i.e., 1.) for the CAwD bus:
  point-to-point connection from the memory chip 10, and further
  point-to-3 point from the first memory chip 10 to the further memory chips 20, 30 and 40 and
2.) the rD bus:
  the memory chips can be separately arranged in two groups, each group having an rD bus width of 4 bits (thus resulting in an 8 bit rD bus width to the memory controller 54, 55), which alternative connections are however only one of a plurality of examples.

For the present invention, the separate routing of the second connecting lines from the memory controller directly to at least one of the memory chips on the memory module is important, while the first connecting lines transferring the CAwD and the rD signal streams may have a great number of different topologies. That is, the details of the topologies of the rD and CAwD busses are not crucial for the present invention.

Those skilled in the art will easily recognize that the above description also includes a method of accessing the semiconductor memory chips. The method comprises providing first connecting lines between the memory controller and at least one of the semiconductor memory chips on the memory module, transferring through channels formed by the first connecting lines, protocol-based data and command signal streams from the memory controller to the at least one of the semiconductor memory chips on the memory module and from there to the memory controller, respectively, providing separate from the first connecting lines second connecting lines from the memory controller directly to at least one of the memory chips on the memory module, and transferring select information through the second connecting lines from the memory controller to the at least one memory chip on the memory module separately from the data and command signal streams, wherein a predetermined function of the at least one memory chip is enabled/disabled in dependency of the select information.

In the above description of the preferred embodiments of the inventive memory system four memory chips are arranged on each memory module 1-5. Therefore a two-bit connection of the second connecting lines from the memory controller to the at least one memory chip, for example the master memory chip 10(M) is sufficient to transfer the select information as a two-bit signal.

It is however to be mentioned that the arrangement of four memory chips on a memory module is only one example and that a different number of memory chips can be arranged on a memory module. Therefore the number of bits of the separate select information, that is the bus width of the second connecting lines not only depends on the amount of information to be transferred and the available area on and the pin count of the memory module but also on the number of memory chips arranged on the memory module.

As already mentioned, the separate select information may include a rank select signal for selecting a memory rank which in the above embodiments designates one of the memory chips and/or a clock enable signal for enabling/disabling separate clocking of the memory chips and therefore allows an effective reduction of power consumption, because the decoding of which memory chip has to be in data processing mode and which memory chip has to be kept in low power mode is not necessary anymore.

Further, the memory chips addressed in the preferred embodiments of the present invention may comprise as an example high speed DDR-DRAM-memory chips having a high transfer rate for example up to 7 Gbit/s, and therefore the power consumption which may arise up to several 20 W and related thermal effects are critical issues which are addressed by the present invention.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory system comprising:
a memory controller; and
at least one memory module on which a number of semiconductor memory chips and connecting lines are arranged in a specified topology, the connecting lines comprising first connecting lines together forming a common transfer channel for a protocol based transfer of data, address and command signal streams from the memory controller to at least one of the memory chips on the memory module and from there to the memory controller, wherein the protocol-based data, address and command signals are in common transmitted through the same first connecting lines, and second connecting lines routed separately and in addition to the first connecting lines from the memory controller directly to at least one of the memory chips on the memory module for transferring select information to the at least one memory chip separately from the data, address and command signal streams, the at least one memory chip having data processing and re-drive functions respectively, arranged for data, address and command signal processing and for carrying out signal re-drive at least for the data address, and command signals to at least one succeeding semiconductor memory chip being connected adjacent to the at least one memory chip on the memory module by the first connecting lines and/or to the memory controller by the first connecting lines, and
the data processing and re-drive commands of the at least one memory chip are respectively further arranged to be activated by the select information as transferred to carry out respective one of data processing and signal re-drive.

2. The memory system of claim 1,
wherein the semiconductor memory chips are arranged in a star topology on the memory module, the at least one memory chip being a dedicated master memory chip and the first connecting lines are connected in a point-to-point connection scheme from the memory controller only to the master memory chip, and the other memory chips on the memory module are respectively connected by the first connecting lines in a point-to-point connection scheme only to the master memory ship and thus forming the star topology; and
wherein the second connecting lines are connecting the master memory chip and all the other memory chips in parallel to the memory controller.

3. The memory system of claim 1, wherein the semiconductor memory chips are arranged on the memory module in a shared loop or loop forward topology, the first connecting lines are connecting the memory controller with a first memory chip and with the last memory chip of the loop in one and the same transfer direction; and
each memory chip on the memory module has a re-drive functions to carry out signal re-drive or at least the data, address and command signals and each memory chip on the memory module is respectively connected in the loop by the first connecting lines to its preceding and succeeding memory chip; and
wherein the second connecting lines are connecting all memory chips on the memory module in parallel to the memory controller.

4. The memory system of claim 1, wherein the semiconductor memory chips are arranged on the memory module in a shared loop or loop forward topology, the first connecting lines are connecting the memory controller with a first memory chip and with the last memory chip of the loop in one and the same transfer direction; and
each memory chip on the memory module has the re-drive functions to carry out signal re-drive for at least the data, address and command signals, and each memory chip on the memory module is respectively connected in the loop by the first connecting lines to its preceding and succeeding memory chip; and
wherein the second connecting lines are connecting all memory chips on the memory module to the memory controller in a star topology.

5. The memory system of claim 1,
wherein the semiconductor memory chips are arranged on the memory module in a shared loop or forward topology, the first connecting lines are connecting the memory controller with a first memory chip and with the last memory chip of the loop in one and the same transfer direction; and
each memory chip on the memory module has the re-drive functions to carry out signal re-drive for at least the data, address and command signals, and each memory chip on the memory module is respectively connected in the loop by the first connecting lines to its preceding succeeding memory chip; and
wherein the second connecting lines are connecting the memory controller with the memory chips on the memory module in a fly-by topology so that the second connecting lines connect the memory controller to the first memory chip and the first memory chip in sequence to that succeeding memory chips until the last memory chip on the memory module for transferring the select information in one and the same transfer direction, and the first to the last but one memory chip on the memory module have the re-drive functions arranged to carry memory module have the re-drive functions arranged to carry out signal re-drive also for the select information.

6. The memory system of claim 1, wherein at least four memory chips are arranged on the memory module and the second connecting lines include at least two parallel second connecting lines for transferring the separate select information as a two bit signal.

7. The memory system of claim 1, wherein the memory chips comprise DDR-DRAM-memory chips.

8. The memory system of claim 7, wherein each different memory rank designates one of the memory chips.

9. The memory system of claim 1, wherein the separate select information includes a clock enable signal for enabling/disabling separate clocking of the memory chips.

10. The memory system of claim 1, wherein the memory chips comprise DDR-DRAM-memory chips.

11. A memory system comprising:
a memory controller; and
at least one memory module on which a number of semiconductor memory chips associated to a number of different memory ranks and connecting lines are arranged in a specified topology, the connecting lines comprising first connecting lines together forming a common transfer channel for a protocol based transfer of data, address and command signal streams for the memory controller to at least one of the memory chips on the memory module and from there to the memory controller, wherein the protocol-based data, address and command signals are in common transmitted through the same first connecting lines and second connecting lines routed separately and in addition to the first connecting lines from the memory controller directly to at least one of the memory chips on the memory module for transferring select information to the at least one memory chip separately from the data, address and command signal streams, wherein the separate select information includes a rank select signal, and the at least one memory chip has rank select signal arranged for carrying out memory rank selection upon being activated by the rank select signal as transferred.

12. The memory system of claim 11, wherein each different memory rank designates one of the memory chips.

13. A memory system comprising:

a memory controller, and at least one memory module on which a number of semiconductor memory chips and connecting lines are arranged in a specified topology, the connecting lines comprising first connecting lines together forming a common transfer channel for a protocol-based transfer of data, address and command signal streams from the memory controller to at least one of the memory chips on the memory module and from there to the memory controller, wherein the protocol-based data, address and command signals are in common transmitted through the same first connecting lines and second connecting lines routed separately and in addition to the first connecting lines from the memory controller directly to at least one of the memory chips on the memory module for transferring select information to at least one memory chip separately from the data, address and command signal streams, wherein the separate select information includes a clock enable signal; and the at least one memory chip has clock enable signals arranged to switch on/switch off clocks generated in the memory chip upon being activated by said clock enable signal as transferred to at least one memory chip.

14. The memory system of claim 3, wherein the semiconductor memory chips are arranged in a star topology on the memory module, the at least one memory chip being a dedicated master memory chips and the first connecting lines are connected in a point-to-point connection scheme only from the memory controller to the master memory chip, and the other memory chips on the memory module are respectively connected by the first connecting lines in a point-to-point connection scheme only to the master memory chip and thus forming the star topology; and wherein the second connecting lines are connecting the memory controller only to the master memory chip and are farther connecting the master memory chip to each of the other memory chips on the memory module for transferring the select information on the memory module and wherein the re-drive mode of the master memory chip are arranged to carry out signal re-drive also for the select information.

15. In a memory system comprising a memory controller and at least one memory module on which a certain number of semiconductor memory chips and connection line are arranged in a respectively specified topology, a method of accessing the semiconductor memory chips, the method comprising:

providing first connecting lines between the memory controller and at least one of the semiconductor memory chips on the memory module;

transferring through a common channel formed only by the first connecting lines, protocol-based data, address and command signal streams from the memory controller to the at least one semiconductor memory chip on the memory module and from there to the memory controller, respectively;

providing separately from the first connecting lines second connecting lines from the memory controller directly to at least one of the memory chips on the memory module; and transferring select information only through the second connecting lines from the memory controller to the at least one memory chip on the memory module separately from the data, address and command signal streams, wherein a predetermined function of the at least one memory chip is enabled/disabled in dependency of the select information.

16. The method of claim 15, wherein the semiconductor memory chips are arranged on the memory module in a star topology, the method further comprising:

providing the at least one memory chip as a dedicted master memory chip and providing in the master memory chip a re-drive function for at least the data, address and command signals; and connecting the first connecting lines from the memory controller in a point-to-point connection scheme to the master memory chip and connecting the first connecting line from the master memory chip to the other memory chips on the memory module while forming the star topology.

17. The method of claim 16, which further comprises connecting the second connecting lines from the memory controller in a point-to-point connecting scheme only to the master memory chip for transferring the select information.

18. The method of claim 17, comprising wherein the second connecting lines are further routed from the master memory chip to each of the other memory chips on the memory module for transferring the separate select information, and wherein the re-drive function of the master memory chip is also provided for re-driving the select information.

19. The method of claim 16, wherein the second connecting lines are connecting the master memory chip and all of the other memory chips in parallel to the memory controller, and the select information is transferred from the memory controller in parallel to all memory chips on the memory module.

20. The method of claim 15, comprising wherein the semiconductor memory chips are arranged on the memory module in a shared loop or loop forward topology, the first connecting lines are provided to connect the memory controller to a first memory chip and to the last memory chip of the loop in one and the same transfer direction, the method further comprising:

providing a re-drive function in all memory chips on the memory module for re-driving at least the data, address and command signals, so that each memory chip on the memory module is respectively connected by the first connecting lines to its adjacent memory chip of the loop.

21. The method of claim 20 which further comprises:

providing the second connecting lines to connect all memory chips on the memory module in parallel to the memory controller and transferring through the second connecting lines the select information in parallel from the memory controller to all memory chips on the memory module.

22. The method of claim 20, comprising wherein the second connecting lines are provided on the memory module for connecting all memory chips in a star topology, and transferring the select information through the second connecting lines provided in the star topology from the memory controller to all memory chips on the memory module.

23. The method of claim 20, which further comprises:
providing the second connecting lines as connecting the memory controller with the memory chips on the memory module in a fly-by topology wherein the select information is transferred from the memory controller to a first and from the first to all further memory chips until to the last memory chip on the memory module in one and the same transfer direction; and
providing a re-drive function also for the select information in the first to the last but one memory chip on the memory module.

24. The method of claim 15, comprising wherein at least four memory chips are arranged on the memory module, and the second connecting lines are routed as at least two parallel second connecting lines, and transferring the select information at least as a two-bit signal.

25. In a memory system comprising a memory controller and at least one memory module on which a certain number of semiconductor memory chips and connection line are arranged in a respectively specified topology, a method of accessing the semiconductor memory chips, the method comprising:
providing first connecting lines between the memory controller and at least one of the semiconductor memory chips on the memory module;
transferring through a common channel formed only by the first connecting lines, protocol-based data, address and command signal streams from the memory controller to the at least one semiconductor memory chip on the memory module and from there to the memory controller, respectively;
providing separately from the first connecting lines second connecting lines from the memory controller directly to at least one of the memory chips on the memory module; and
transferring select information only through the second connecting lines from the memory controller to at least one memory chip on the memory module separately from the data, address and command signal streams, wherein
a predetermined function of the at least one memory chip is enabled/disabled in dependency of the select information, wherein the select information is transferred as a rank select signal for selecting a memory rank on the memory module.

26. The method of claim 25, wherein each different rank select signal designates one of the memory chips.

27. The method of claim 25, wherein the select information transfers a clock enable signal for enabling/disabling separate clocking of the memory chips.

28. The method of claim 25, wherein the memory chips are provided as DDR-DRAM memory chips.

29. A memory system comprising:
a memory controller; and
at least one memory module on which a number of semiconductor memory chips and connecting lines are arranged in a specified topology, the connecting lines comprising first connecting lines forming transfer channels for a protocol based transfer of data, address and command signal streams from the memory controller to at least one of the memory chips on the memory module and from there to the memory controller, and second connecting lines routed separately from the memory controller directly to at least one of the memory chips on the memory module for transferring select information to the at least one memory chip separately from the data, address and command signal streams.

* * * * *